United States Patent [19]
Katoh

[11] Patent Number: 5,134,451
[45] Date of Patent: Jul. 28, 1992

[54] MOS SEMICONDUCTIVE DEVICE
[75] Inventor: Teruo Katoh, Tokyo, Japan
[73] Assignee: Oki Electric Industry Co., Ltd., Japan
[21] Appl. No.: 509,478
[22] Filed: Apr. 13, 1990
[30] Foreign Application Priority Data
  Apr. 17, 1989 [JP] Japan .................................. 1-95161
[51] Int. Cl.$^5$ .......................................... H01L 29/78
[52] U.S. Cl. .................................. 357/23.15; 357/23.1;
  357/67; 357/71
[58] Field of Search ...................... 357/23.15, 67 S, 56,
  357/71 S, 23.1
[56]         References Cited
        U.S. PATENT DOCUMENTS

| | | | |
|---|---|---|---|
| 4,384,301 | 5/1983 | Tasch, Jr. et al. | 357/67 S |
| 4,510,670 | 4/1985 | Schwabe et al. | 357/71 S |
| 4,714,951 | 12/1987 | Baudrant et al. | 357/71 S |
| 4,735,680 | 4/1988 | Yen | 357/67 S |
| 4,746,219 | 5/1988 | Holloway et al. | 357/67 S |
| 4,866,491 | 9/1989 | Solomon et al. | 357/56 |

FOREIGN PATENT DOCUMENTS

| | | | |
|---|---|---|---|
| 0062987 | 6/1978 | Japan | 357/23.15 |
| 0046535 | 4/1980 | Japan | 357/67 S |
| 0210671 | 11/1984 | Japan | 357/23.15 |
| 0088474 | 5/1985 | Japan | 357/67 S |
| 0140577 | 6/1988 | Japan | 357/23.15 |

*Primary Examiner*—Rolf Hille
*Assistant Examiner*—Tan Ho
*Attorney, Agent, or Firm*—Edward D. Manzo

[57] ABSTRACT

A semiconductive device which comprises a gate insulating film composed of a metal oxide film, source/drain electrodes, and metal silicide layers formed on the source/drain regions is described.

11 Claims, 4 Drawing Sheets

Fig. 2c
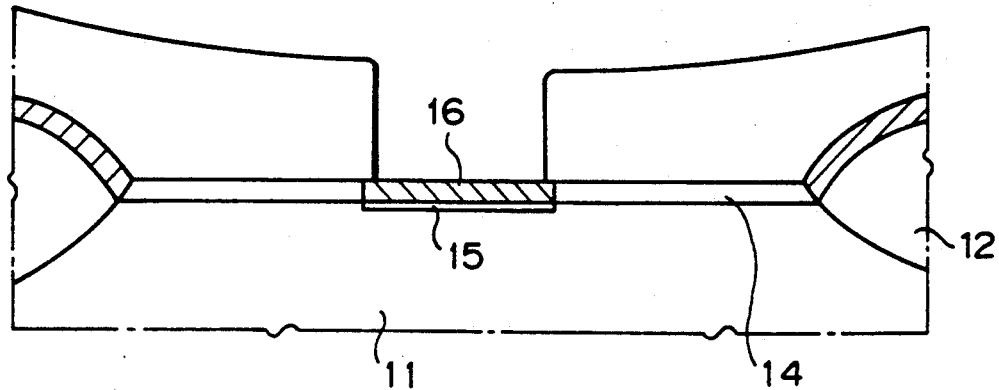
Fig. 2d
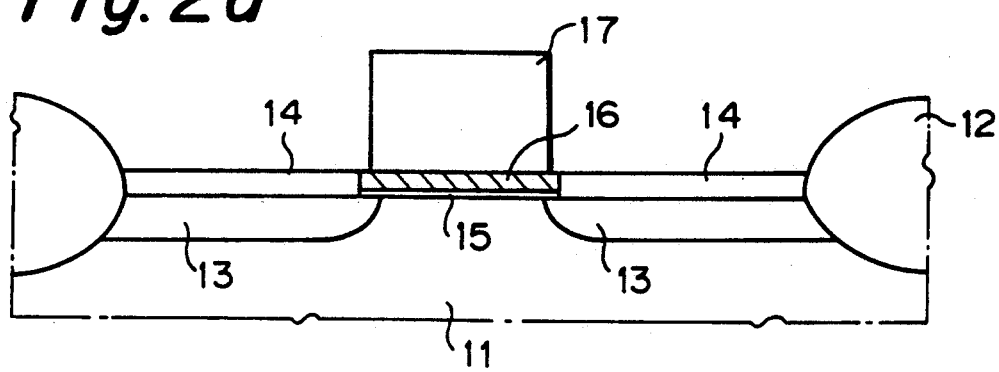
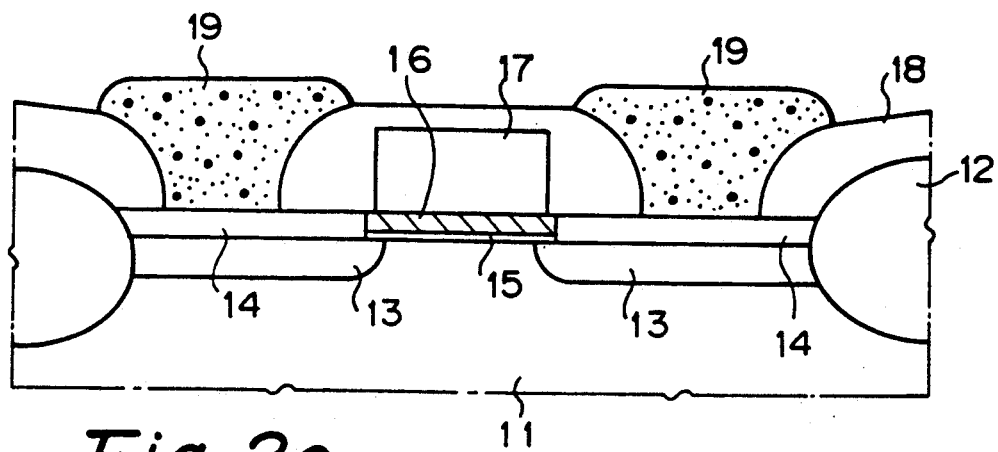
Fig. 2e

Fig. 3d
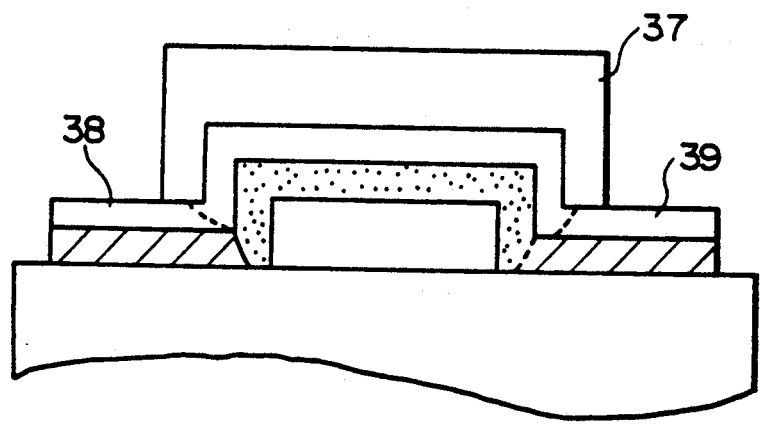
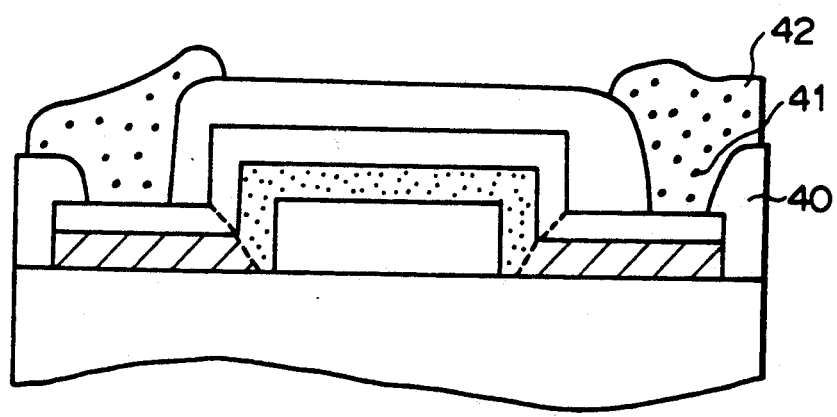
Fig. 3e

MOS SEMICONDUCTIVE DEVICE

BACKGROUND OF THE INVENTION

1. Field of The Invention

This invention relates to a semiconductive device and its fabrication and more particularly, to a MOS semiconductive device having a good withstanding voltage characteristic of the gate insulating film and a method for making such a device as mentioned above.

2. Description of The Prior Art

In order to realize high performance of MOS semiconductive devices, it is a recent trend to miniaturize the semiconductive device by utilizing the scaling rule. However, the miniaturized semiconductive devices involve the following problems.

(1) Since the depth of the junction of source/drain becomes small, the parasitic resistance of the source/drain increases. Although the shortage of the channel length makes it possible to increase the drain current, it is difficult to attain a drain current which will be passed through the MOS transistor prior to the miniaturization.

(2) Since the gate insulating film is formed as thin, the withstanding voltage characteristic of the gate insulating film is lessened. In addition, a phenomenon is observed wherein the gate current increases by tunneling. This tunneling phenomenon becomes more pronounced when the gate oxide film is made of a silicon oxide film with a thickness of not larger than about 5 nm.

In order to solve these problems, several proposals have been made as follows. With respect to the problem (1), for example, the source/drain are converted into silicide on the surfaces thereof. With respect to problem (2), a silicon nitride film which has a specific inductive capacity higher than the silicon oxide film is formed as the gate insulating film.

However, these proposals have also the following problems.

The specific inductive capacity of silicon nitride film, which is 7.4, is not much higher than that of silicon oxide film which is 3.4. Accordingly, the silicon nitride film is not considered as useful for solving the problem (2). Thus, the above. problem (2) has not been satisfactorily solved yet. In addition, the proposed technique of silicificating the surface portions of the source/drain presents another problem in that the fabrication process undesirably increases in number of steps.

SUMMARY OF THE INVENTION

It is accordingly an object of the invention to provide a semiconductive device which can solve the problem accompanied by the formation of a thin gate insulating film as stated before and which has a great drain current and good properties.

It is another object of the invention to provide a method for fabricating a semiconductive device by a simple procedure without complicating the procedure for fabricating high performance MOS semiconductive devices.

The present invention provides a semiconductive device which comprises source/drain regions, a metal silicide film formed on the source/drain regions, a gate electrode, and a metal oxide film formed below the gate electrode, and also a method for fabricating such a semiconductive device as mentioned above.

In the above semiconductive device, the metal oxide film serves as a gate insulating film. The metal oxide film such as, for example, a tantalum oxide film, has a specific inductive capacity of 22 which is higher than those of silicon dioxide and silicon nitride, i.e. the specific inductive capacities of silicon dioxide and silicon nitride are, respectively, 3.9, and 7.4. When the metal oxide film is applied as a gate insulating film of MOS semiconductive device, the drain current becomes higher for the same film thickness. Alternatively, for obtaining the same level of drain current, a thicker film can be made. Thus, the known problems involved in the formation of thin gate insulating film or physical problems such as of reliability, controllability and tunneling, can be solved.

On the other hand, the metal silicide film on the source-drain regions, e.g. tantalum silicide has a specific resistance of about 70 $\mu\Omega$ cm, which is smaller than highly doped silicon (p≈300−100 $\mu\Omega$ cm). Accordingly, the problem that the parasitic resistance of the source/drain increases can be solved, which leads to the possibility of increasing the drain current.

The above and other objects, features and advantages of the present invention will become more apparent from the following description taken in conjunction with the accompanying drawings.

BRIEF DESCRIPTION OF THE DRAWINGS

FIGS. 2(a) to 2(e) are, respectively, sectional views showing the steps of fabricating the semiconductive device of the first embodiment of the invention; and FIGS. 3(a) to 3(e) are, respectively, sectional views showing the steps of fabricating a semiconductive device according to a second embodiment of the invention.

DETAILED DESCRIPTION AND EMBODIMENTS OF THE INVENTION

Figure 1:
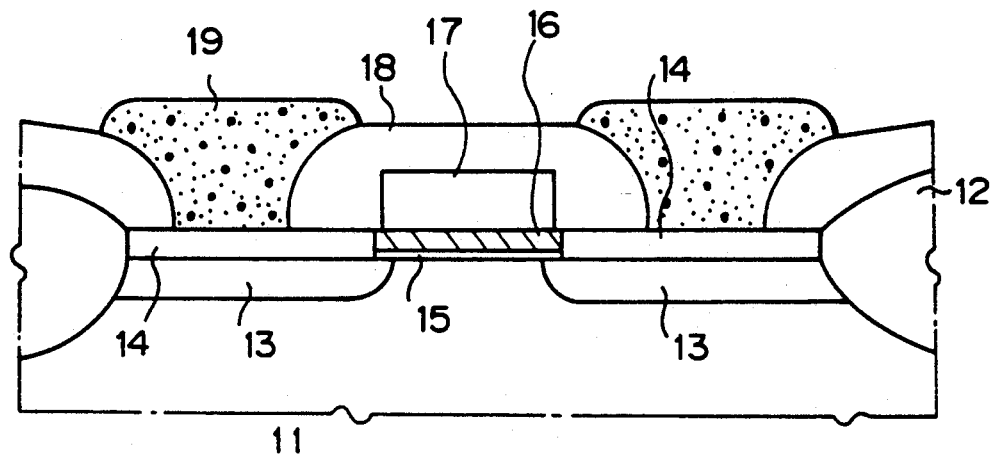
FIG. 1 is a sectional view of the structure of a semiconductive device according to a first embodiment of the invention.

Reference is now made to the accompanying drawings and particularly, to FIG. 1. In FIG. 1, there is shown a semiconductive device according to a first embodiment of the invention. In the figure, there is shown the semiconductive device which includes a substrate 11 and a field oxide film 12 by which the substrate 11 is separated into an element-forming region and a field region as shown. Diffusion layers 13 serving as a source/drain are formed on the surface portion of the element-forming region and a channel region is formed between the diffusion layers 13. A metal silicide 14 such as, for example, tantalum silicide, is formed on the diffusion layers 13.

On the other hand, a metal oxide film such as, for example, a tantalum oxide film 16 (tantalum pentaoxide film) serving as a gate oxide film is formed on the surface of the channel region of the substrate 11 through a thin silicon oxide film 15. This silicon oxide film 15 also acts as part of the gate insulating film. In this sense, this device has a two-layered insulating film consisting of the silicon oxide film 15 and the tantalum oxide film 16.

A gate electrode 17 is formed on the tantalum oxide film 16 as shown. In addition, an intermediate insulating film 18 is formed over the substrate 11 including the gate electrode 17. Wiring electrodes 19 are connected to the tantalum silicide films 14 and the gate electrode 17 (not shown) through contact holes made in the intermediate insulating film 18. The tantalum oxide film 16 serving as the gate insulating film has a specific inductive capacity which is significantly higher than that of silicon dioxide or silicon nitride which has been conventionally used in the silicon process, i.e. the specific inductive capacity of the tantalum oxide film is 22 and those of silicon dioxide and silicon nitride are, respecitvely, 3.9 and 7.4. Accordingly, when the respective gate insulating films are, respectively, applied to the semiconductive device according to the first embodiment of the invention and the known semiconductive device for the same thickness level, the drain current of the semiconductive device of the invention becomes higher. For the same level of drain current, the thickness of the insulating film used in the device of the invention can be made larger than that used in the known device. In this manner, the semiconductive device according to the invention can solve all the physical problems such as, for example, reliability, controllability and tunneling, involved in the formation of thin gate insulating film in the known semiconductive devices.

It should be noted that a tantalum pentaoxide capacitor formed on silicon or polysilicon has been reported as being formed at a very low density of defects and as having high breakdown strength.

The tantalum silicide film 14 has a specific resistance of about 20 $\mu\Omega$.cm which is smaller than that of silicon highly doped with an imurity ($p \approx 300 - 1000$ $\mu\Omega$.cm). This leads to dissolution of the known problem that the source/drain junction become smaller in junction, so that the parasitic resistance of the source/drain increases, meaning that the drain current can be increased according to the invention.

The MOS semiconductive device shown in FIG. 1 can be fabricated by the procedure shown in FIG. 2.

Figure 2A:
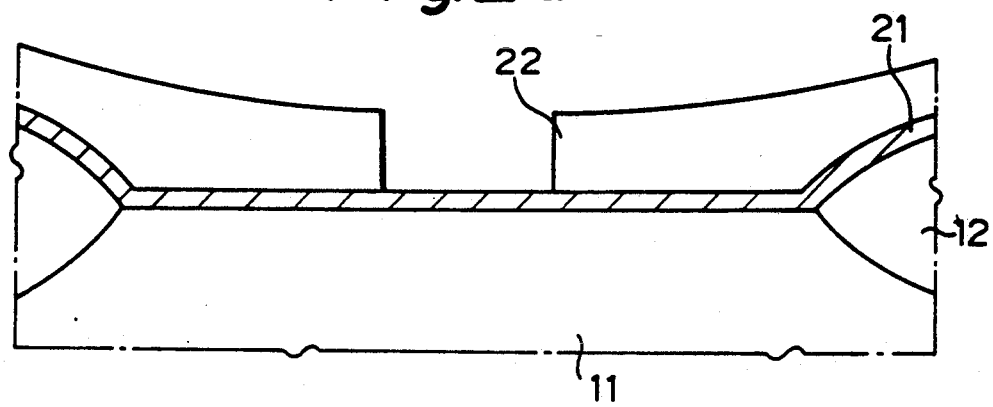

As is shown in FIG. 2(a), the field oxide film 12 is selectively formed on the silicon substrate 11 in a thickness of about 600 nm according to any known technique. This field oxide film 12 is separated into the field region and the element-forming region as shown. Subsequently, a tantalum thin film 21 is deposited over one side of the substrate 11 in a thickness of 30 nm, for example, by sputtering. Over the tantalum thin film 21 is further formed a silicon nitride film, 22 in a thickness of 250 nm. Thereafter, according to the photolithographic technique, the silicon silicide film 22 is selectively removed from the gate region in the element-forming region. It will be noted that the thickness of the tantalum thin film 21 is coincident with a thickness of the tantalum oxide film serving as the gate insulating film and a thickness of the tantalum silicide film of the source/drain, both formed in subsequent steps. Preferably, in order to improve the characteristics of the device, the gate insulating film should be formed as thin and the silicide film should be formed as thick. As stated before, the tantalum thin film 21 from which the gate insulating film and the silicide film are to be formed is formed at one time, so that the thickness of the tantalum thin film is appropriately in the range of 20 to 50 nm because the trading-off of the above relation.

If the problem of additional fabrication steps is neglected, it is possible to separately form a tantalum thin film with a smaller thickness on the channel region and a tantalum thin film with a larger thickness on the diffusion layer.

Figure 2B:
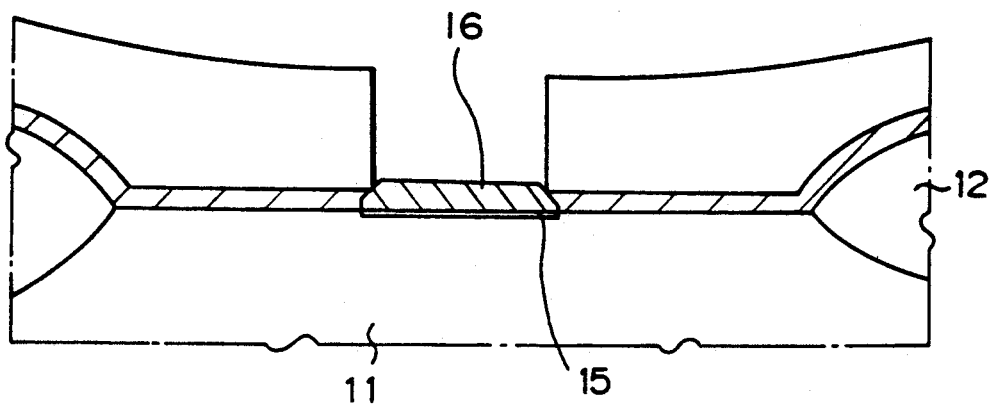

As shown in FIG. 2(b), the tantalum thin film 21 on the channel region is converted into a tantalum oxide film (Ta$_2$O$_5$) 16 by an anodizing method wherein the silicon nitride film 22 is utilized as a mask.

Thereafter, the tantalum thin film 21 in portions other than that from which the tantalum oxide film 16 has been formed, i.e. the tantalum thin film 21 which has been covered with the silicon nitride 22 in the source/drain-forming region of the element-forming region, is thermally treated preferably under conditions of from 400° to 600° C. and from 10 to 100 minutes, thereby causing the tantalum thin film to react with the silicon substrate 11 for conversion into a tantalum silicide film (TaSi$_2$).

This reaction takes place at temperatures of not lower than 400° C. and proceeds more quickly at higher temperatures. Under high temperature conditions of not lower than 600° C., however, the tantalum oxide film 16 also reacts with the silicon substrate 11, thereby lowering the insulating characteristics of the tantalum oxide film 16. Accordingly, the thermal treatment temperature should preferably be not higher than 600°.

The silicon oxide film 15 shown in FIG. 2(b) is formed between the tantalum oxide film 16 and the silicon substrate 11 in order to eliminate the limitation on the temperature. This silicon oxide 15 is formed in a thickness of from 5 to 10 angstroms at the time of the anodization. Although the silicon oxide film is unnecessary when the thermal treatment is effected at temperature of not higher than 600° C., the formation of the silicon oxide film is effective in view of the ease of the fabrication of the tantalum silicide, the temperature control during the course of the thermal treatment and the yield. In the practice of the invention, the silicon oxide film 15 is conveniently formed.

Thereafter, as shown in FIG. 2(d), the gate electrode 17 is formed on the tantalum oxide film 16 (gate insulating film) by the lift-off or etch-back method, and the unreacted tantalum thin film 21 on the field oxide film 12 and the silicon nitride film 22 are removed, after which the diffusion layers 13 serving as the source/drain regions are formed in the surface portion of the substrate 11 below the tantalum silicide film 14 by ion injection through the mask of the gate electrode 17.

In view of the specific resistance and the reactivity with the tantalum oxide film 16, the material for the gate electrode 17 is suitably a high melting metal such as tungsten. Although the gate electrode material may be made of polysilicon, the use of the polysilicon as the gate electrode 17 requires formation of a 5 to 20 nm thick silicon nitride film between the tantalum oxide film 16 and the polysilicon in order to avoid the reaction with the tantalum oxide film 16.

Finally, as shown in FIG. 2(e), the intermediate insulating film 18 is formed over the substrate 11. Contact holes in which wiring electrodes 19 (made of two or more layers, if necessary) are formed to complete the device of FIG. 1.

In the above embodiment, although the tantalum thin film is used as the metal film, other metals may be used provided that the oxide of such a metal has good insulating characteristics and the metal is capable of forming a metal compound with silicon. Examples of such a metal include titanium, zirconium and the like. In this case, a titanium oxide film or zirconium oxide film is used as the insulating film and a titanium silicide film or zirconium silicide film is used as the metal silicide for the source/drain.

In the practice of the invention, the silicon nitride film is employed as the protective film for oxidation or a mask material for oxidation but any material having the capability of an oxidation mask may be used instead of the silicon nitride.

In the above embodiment, although the gate electrode 17 has been formed by the lift-off or etch-back method, the formation is not critically effected by these methods. For instance, after the formation of the tantalum oxide film 16 and the tantalum silicide film 14, the silicon nitride film is once removed, after which the gate electrode 17 may be freshly formed by an ordinary method. According to the lift-off or etch-back method set out in the embodiment, the gate electrode 17 can be selfalignedly formed relative to the tantalum oxide film 16/tantalum silicide film 14.

The second embodiment of the invention is described with reference to FIGS. 3(a) to 3(e). The second embodiment is an application of the metal oxide film/metal silicide film to a thin film transistor wherein a semiconductive thin film formed on an insulating film is used as an active element.

Figure 3A:
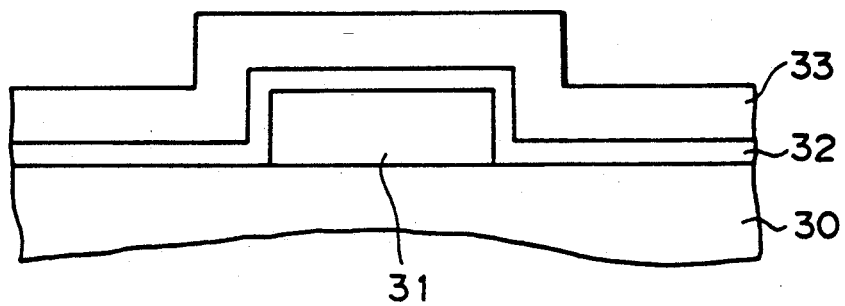
Figure 3B:
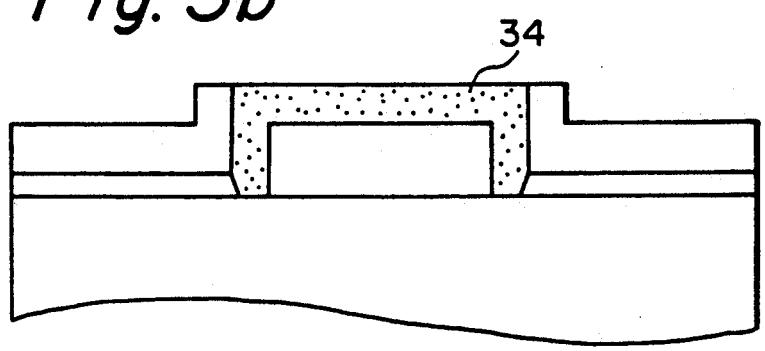

In FIG. 3(a), there is shown a glass substrate 30 on which a 300 nm thick gate electrode 31 made of polysilicon is formed. Subsequently, a tantalum thin film 32 is deposited in a thickness of 30 nm by sputtering, followed by further deposition of a silicon nitride film 33 in a thickness of 150 nm.

The thickness of the tantalum thin film 32 coincides with a thickness of a tantalum pentaoxide film serving as a gate oxide film and a thickness of each of source/drain silicide layers, both formed in subsequent steps. The thickness of the tantalum thin film should appropriately be in the range of from 20 to 50 nm for the same reason as stated in the first embodiment.

Then, the substrate is entirely covered with a photoresist (not shown), which is etched back until the silicon nitride film 33 is exposed. Since the gate electrode 31 is present, the portion of the silicon nitride film which is above the gate electrode 31 is initially exposed. Thereafter, the exposed silicon nitride film is removed by etching through the photoresist, followed by removal of the photoresist. The remaining silicon nitride film which has been exposed by the removal of the photoresist is utilized as a mask for anodization, so that the tantalum thin film is converted into a tantalum oxide film ($Ta_2O_5$) 34 as is particularly shown in FIG. 3(b).

This tantalum oxide film 34 is self-alignedly formed relative to the gate electrode 31.

Figure 3C:
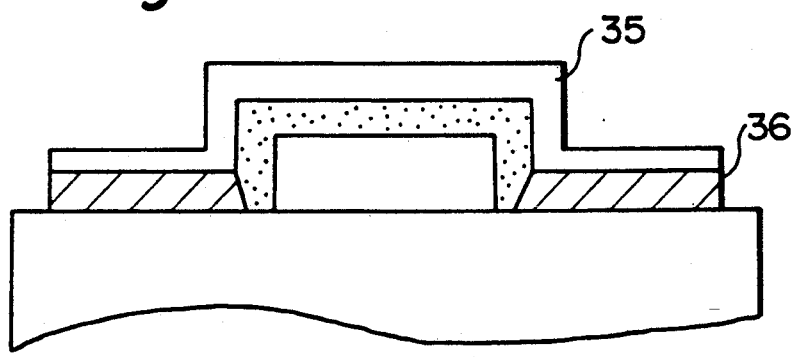

As shown in FIG. 3(c), after the removal of the silicon nitride film, a polysilicon thin film 35 is formed on the entire surface of the substrate. When the substrate is thermally treated under conditions of 400° to 600° C. and 10 to 100 minutes, the tantalum thin film 32 in portions other than the portion formed as the tantalum oxide film 34 is reacted with the polysilicon thin film 35 for conversion into a tantalum silicide film ($TaSi_2$) 36.

Similar to the first embodiment, a silicon oxide film (not shown) may be formed between the tantalum oxide film and the polysilicon thin film for the same reason as stated in the first embodiment.

Thereafter, part of the polysilicon film 35 and an unnecessary portion or region of the tantalum silicide film are removed.

In FIG. 3(d), source and drain regions 38 and 39 are formed by ion injection through a photoresist mask 37 as shown. The mask for the ion injection is not always the same size as the gate electrode 31, but should favorably have a size somewhat larger than that of the electrode 31.

The diffusion rate of impurity is faster in the silicide film, so that the diffusion regions of the source/drain are self-alignedly formed by the existence of the silicide.

Finally, an intermediate insulating film 40, contact holes 41 and aluminum wiring electrodes 42 are formed to complete a semiconductive device as shown in FIG. 3(e). If necessary, an insulating film and aluminium wiring electrode or electrodes may be further formed as desired.

As described above, according to the second embodiment of the invention, the high dielectric constant gate insulating film and the source/drain regions of the silicide junction are formed self-alignedly relative to the gate electrode. Accordingly, the characteristic properties of the device can, be improved.

The self-aligned silicificated source/drain regions can reduce the parasitic resistance. For instance, the parasitic resistance of a known device having the same film thickness as the device of the invention is in the range of from 0.5 to 1 K$\Omega$/□, whereas the parasitic resistance of the invention is in the range of from 3 to 5 $\Omega$/□, which is about 1/200 of the known device. Thus, the parasitic resistance of the, device, according, to the invention can be so small as to be negligible.

The metal film used in the second embodiment may be made of titanium or zirconium for the same reason as stated in the first embodiment. In the second embodiment, the single-layered thin film transistor has been illustrated, but two or multi-layered thin film transistors may be fabricated according to the invention. Moreover, the invention is also applicable to MOS FET formed on a silicon substrate.

According to the semiconductive device or the invention which has a metal oxide film formed as a gate oxide film and having a high specific inductive capacity and a metal silicide film formed on or below, source/drain regions and having a small specific resistance, there can be solved the problem involved in the thin film formation of a gate insulating film with an increasing drain current and improved characteristic properties.

According to the fabrication method of the invention, the metal oxide film/metal silicide film can be formed self-alignedly while commonly using part of the steps, so that the device optimumly showing the, above advantages can be readily obtained without any undue complexity.

Although the invention has been described in its preferred form with a certain degree of particularity, it is to be understood that many variations and changes are possible in the invention without departing from the scope thereof.

What is claimed is:

1. A semiconductor device comprising:
   a substrate having a first conductivity type;
   a source region and a drain region, each having a second conductivity type, separately disposed within a surface of said substrate, said source and drain regions defining a channel region therebetween;
   a single layer, comprising a metal material, extending over said substrate;
   said single layer having first and second metal silicide portions covering said source region and drain region, and a metal oxide portion extending over said channel region; and
   a gate electrode extending over said metal oxide portion.

2. The device according to claim 1, further comprising a thin insulating layer covering said channel region, wherein said metal oxide portion covers said insulating layer; said thin insulating layer and metal oxide portion thereby forming a composite gate insulator.

3. The device according to claim 2, wherein said first and second metal silicide portions comprise tantalum silicide and wherein said metal oxide portion comprises tantalum oxide.

4. The device according to claim 3, wherein said thin insulating layer comprises a silicon oxide layer, said silicon oxide layer being formed in coincidence with said metal oxide portion.

5. The device of claim 1 wherein said single layer is continuous between said metal silicide portions.

6. A semiconductor device comprising:
a substrate having a major surface;
a gate electrode extending over a first portion in said major surface of said substrate;
a single layer, comprising a metal material, extending over said major surface and gate electrode;
said single layer having first and second metal silicide portions respectively extending over corresponding second and third portions in said major surface of said substrate, said second and third portions defining said first portion therebetween; and a metal oxide portion established on said gate electrode;
a silicon material layer, established on said single layer, covering said first and second metal silicide portions and said metal oxide portion, said silicon material layer including source and drain regions therein each doped with a predetermined impurity and disposed on said first and second metal silicide portions, said silicon material layer further including a channel region therein disposed on said metal oxide portion.

7. The device according to claim 6, wherein said first and second metal silicide portions comprises a tantalum silicide portion and wherein said metal oxide layer comprises tantalum oxide.

8. The device according to claim 6, wherein said major surface of said substrate is covered with a thin insulating layer and wherein said gate electrode and said first and second metal silicide portion of said single layer cover said thin insulating layer.

9. The device according to claim 6 wherein said single layer is continuous between said metal silicide portions.

10. A semiconductor device of the type having a substrate having a first conductivity type, a source region and a drain region, each having a second conductivity type, the source and drain regions being spaced apart and located within a surface of said substrate to define a channel region therebetween, and a gate electrode located over the channel, further comprising:
a single layer comprising a metal material extending over said substrate, said single layer consisting essentially of first and second metal silicide portions covering said source region and drain region, and a metal oxide portion extending over said channel region; and
wherein said gate electrode extends over said metal oxide portion.

11. The device of claim 10 wherein said single layer is continuous between said metal silicide portions.

* * * * *